(12) United States Patent
Kinoshita et al.

(10) Patent No.: US 10,677,262 B2
(45) Date of Patent: Jun. 9, 2020

(54) FLUID MACHINE

(71) Applicant: KABUSHIKI KAISHA TOYOTA JIDOSHOKKI, Kariya-shi, Aichi-ken (JP)

(72) Inventors: Yusuke Kinoshita, Kariya (JP); Shingo Enami, Kariya (JP); Junya Yano, Kariya (JP)

(73) Assignee: KABUSHIKI KAISHA TOYOTA JIDOSHOKKI, Kariya-shi, Aichi-ken (JP)

( * ) Notice: Subject to any disclaimer, the term of this patent is extended or adjusted under 35 U.S.C. 154(b) by 291 days.

(21) Appl. No.: 15/853,028

(22) Filed: Dec. 22, 2017

(65) Prior Publication Data

US 2018/0180061 A1 Jun. 28, 2018

(30) Foreign Application Priority Data

Dec. 28, 2016 (JP) .................................. 2016-255117

(51) Int. Cl.
  *F04D 29/58* (2006.01)
  *F04B 39/06* (2006.01)
  (Continued)

(52) U.S. Cl.
  CPC .......... *F04D 29/5813* (2013.01); *F04B 35/04* (2013.01); *F04B 39/06* (2013.01); (Continued)

(58) Field of Classification Search
  CPC ...... F04D 29/5813; F04D 25/06; F04D 13/06; F04D 13/0686; F04B 39/121; F04B 35/04; (Continued)

(56) References Cited

U.S. PATENT DOCUMENTS 5,608,611 A  3/1997 Szudarek et al.
6,997,687 B2 2/2006 Iritani
(Continued)

FOREIGN PATENT DOCUMENTS

JP  2002-070817 A  3/2002
JP  2003-324900 A  11/2003
(Continued)

*Primary Examiner* — Patrick Hamo
*Assistant Examiner* — David N Brandt
(74) *Attorney, Agent, or Firm* — Sughrue Mion, PLLC

(57) ABSTRACT

A motor-driven compressor includes collars, which maintain the gap between a cover and an outer surface of a first housing member. Fasteners fasten the cover to the first housing member. Each collar is arranged to face a seating surface of the head of the corresponding fastener such that the cover is sandwiched between the collars and the seating surfaces. Each collar thus includes a facing portion, which faces the seating surface and receives a pressing force from the seating surface via the cover, and a transmitting portion, which transmits the pressing force received at the facing portion to a base member. Accordingly, the pressing force applied through the seating surface of the fastener is transmitted to the base member through the collar, so that the base member is pressed against the outer surface of the first housing member.

6 Claims, 4 Drawing Sheets

(51) Int. Cl.
  *F04B 35/04* (2006.01)
  *F04D 25/06* (2006.01)
  *F04B 39/12* (2006.01)
  *H01L 23/40* (2006.01)
  *F04B 53/08* (2006.01)
  *F04D 13/06* (2006.01)

(52) U.S. Cl.
  CPC ............ *F04B 39/121* (2013.01); *F04B 53/08* (2013.01); *F04D 13/06* (2013.01); *F04D 25/06* (2013.01); *H01L 23/4006* (2013.01); *F05D 2260/31* (2013.01)

(58) Field of Classification Search
  CPC .......... F04B 39/06; F04B 53/08; F04B 17/03; F16B 5/02; H01L 23/40–4006; H01L 2023/4043; H01L 2023/405; H01L 2023/4062; H01L 2023/4081; H01L 2023/4087; H05K 7/2049
  See application file for complete search history.

(56) References Cited

U.S. PATENT DOCUMENTS

| | | | |
|---|---|---|---|
| 7,252,469 B2 * | 8/2007 | Zaluzec | B62D 23/00 411/34 |
| 2009/0010786 A1 | 1/2009 | Koide et al. | |
| 2013/0049550 A1 | 2/2013 | Watanabe et al. | |
| 2013/0108486 A1 * | 5/2013 | Suitou | F04O 23/008 417/410.1 |
| 2015/0061421 A1 * | 3/2015 | Yano | H02K 9/00 310/52 |

FOREIGN PATENT DOCUMENTS

| | | |
|---|---|---|
| JP | 2007-224902 A | 9/2007 |
| JP | 2011-163231 A | 8/2011 |

* cited by examiner

FLUID MACHINE

BACKGROUND OF THE INVENTION

The present invention relates to a fluid machine.

As one type of fluid machine, for example, a motor-driven compressor described in Japanese Laid-Open Patent Publication No. 2003-324900 has been known. The motor-driven compressor has a housing. The housing accommodates a compression portion, which compresses refrigerant, and an electric motor, which drives the compression portion. A cover is fixed to the outer surface of the housing. The cover accommodates an inverter that drives the electric motor. The inverter has a circuit board on which various types of electronic components are mounted. The electronic components mounted on the inverter circuit board include an electrolytic capacitor. The electrolytic capacitor is mounted on the circuit board via leads.

The electronic components such as electrolytic capacitors generate heat when the inverter is driven. In a motor-driven compressor, a circuit board is attached to a metal base and electronic components such as electrolytic capacitors are placed on the base. The base is arranged on the outer surface of the housing to serves as a heat radiating member. This structure radiates the heat generated by the electronic components to the housing via the base. The more enhanced the contact between the housing and the base, the more improved the heat radiation performance becomes. The contact between the housing and the base thus needs to be enhanced.

SUMMARY OF THE INVENTION

Accordingly, it is an objective of the present invention to provide a motor-driven compressor with an improved heat radiation performance.

To achieve the foregoing objective and in accordance with a first aspect of the present disclosure, a fluid machine is provided that includes a housing member, which is provided with an inlet into which fluid is drawn, an electric motor, which is accommodated in the housing member, a cover, which is attached to an outer surface of the housing member, an inverter, a heat radiating member, a fastener, and a gap maintaining member. The inverter is accommodated in an accommodating space defined by the outer surface of the housing member and the cover, has a circuit board on which an electronic component is mounted, and drives the electric motor. The heat radiating member is arranged between the circuit board and the housing member and on which the electronic component is placed. The heat radiating member radiates heat of the electronic component. The fastener fastens together the housing member and a member to be fastened, which is at least one of the cover and the circuit board. The gap maintaining member maintains a gap between the member to be fastened and the heat radiating member. The fastener includes a fastening pin and a pressing portion. The fastening pin includes a first end and a second end, which are opposite ends in an axial direction. The second end is located on the opposite side from the first end. The first end of the fastening pin is fastened to an insertion hole provided in the housing member. The pressing portion includes a seating surface, which is located at the second end of the fastening pin and applies a pressing force to the member to be fastened. The gap maintaining member is arranged to face the seating surface such that the member to be fastened is sandwiched between the gap maintaining member and the seating surface. The gap maintaining member includes a facing portion, which faces the seating surface and receives a pressing force from the seating surface via the member to be fastened, and a transmitting portion, which transmits the pressing force received at the facing portion to the heat radiating member.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

First Embodiment

A motor-driven compressor 10 according to one embodiment, which is a fluid machine, will now be described with reference to FIGS. 1 to 2. The motor-driven compressor 10 is used in a vehicle air conditioner.

Figure 1:
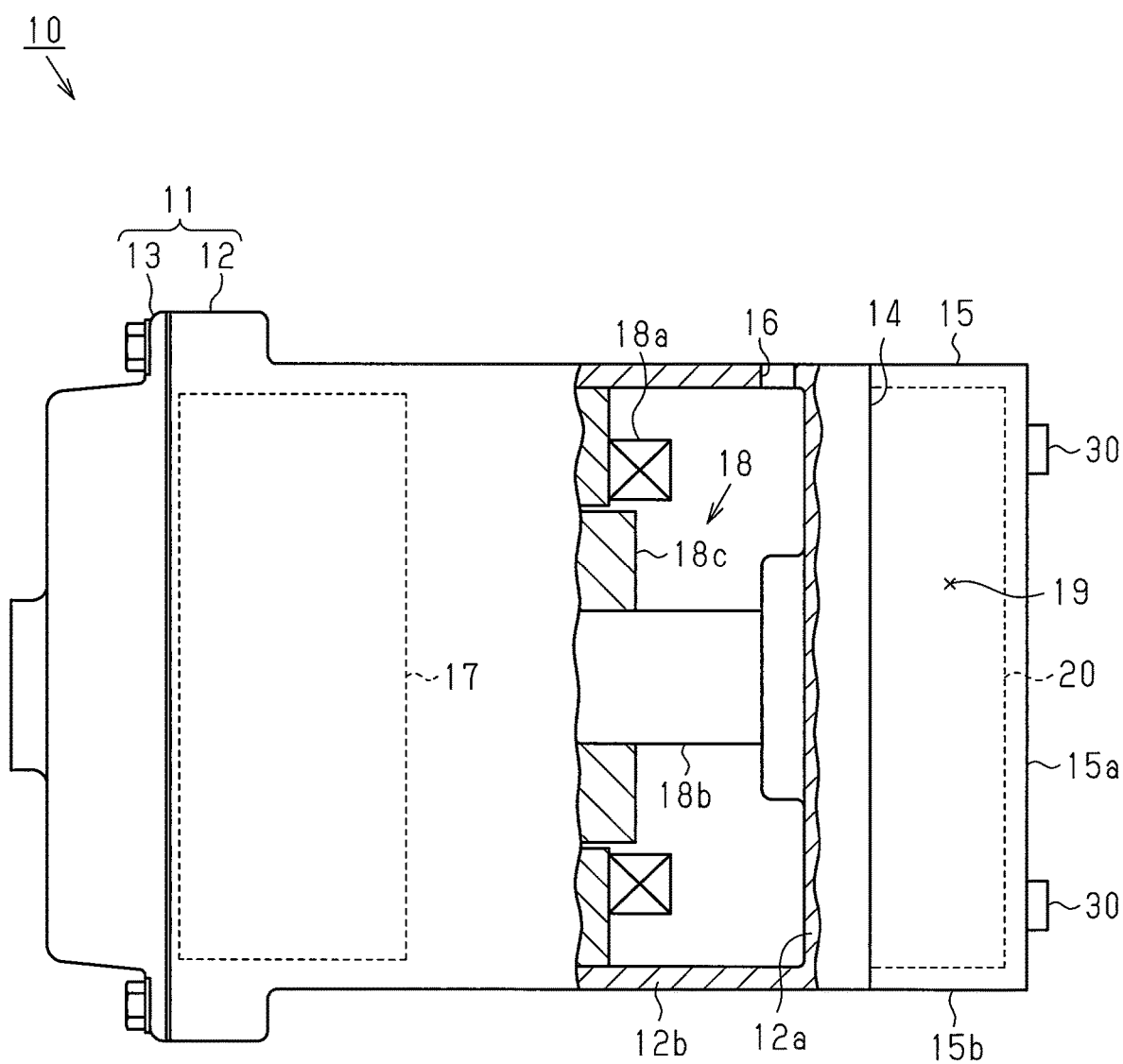
FIG. 1 is a schematic view, with a part cut away, illustrating an entire motor-driven compressor of the present invention.

As shown in FIG. 1, the motor-driven compressor 10 has a cylindrical housing 11 and a cylindrical cover 15 having a closed end. The housing 11 is made of a metal material such as aluminum. The housing 11 has a first housing member 12 and a second housing member 13. The housing members 12, 13 are cylindrical and each have a closed end. The first housing member 12 is composed of a plate-shaped bottom wall 12a and a side wall 12b, which extends from the periphery of the bottom wall 12a. The second housing member 13 is assembled to the first housing member 12 while closing the opening of the first housing member 12. The first housing member 12 has an inlet 16, which extends through the side wall 12b in the radial direction of the first housing member 12. Refrigerant, which is fluid, is drawn into the first housing member 12 via the inlet 16.

The first housing member 12 accommodates a compression portion 17, which compresses the refrigerant in a compression chamber, and an electric motor 18, which drives the compression portion 17. The electric motor 18 has a rotary shaft 18b, a rotor 18c, which is integrated with the rotary shaft 18b, and a stator 18a, which is provided on the inner circumferential surface of the first housing member 12. The axis of the rotary shaft 18b coincides with the axis of the first housing member 12.

The cover 15 is composed of a bottom portion 15a and a side portion 15b, which extends from the periphery of the bottom portion 15a. The bottom wall 12a has a first surface and a second surface. The first surface faces the electric motor 18 and the second surface is opposite to the first surface. The cover 15 is attached to the second surface of the bottom wall 12a (a portion denoted by the reference numeral 14 in FIG. 1). The cover 15 and the bottom wall 12a of the first housing member 12 define an accommodating space 19. The surface of the bottom wall 12a of the first housing member 12 that is opposite to the electric motor 18 corresponds to an outer surface 14 of the housing 11. The accommodating space 19 accommodates an inverter module 20, which drives the electric motor 18. That is, the inverter module 20 is covered with the cover 15.

Figure 2:
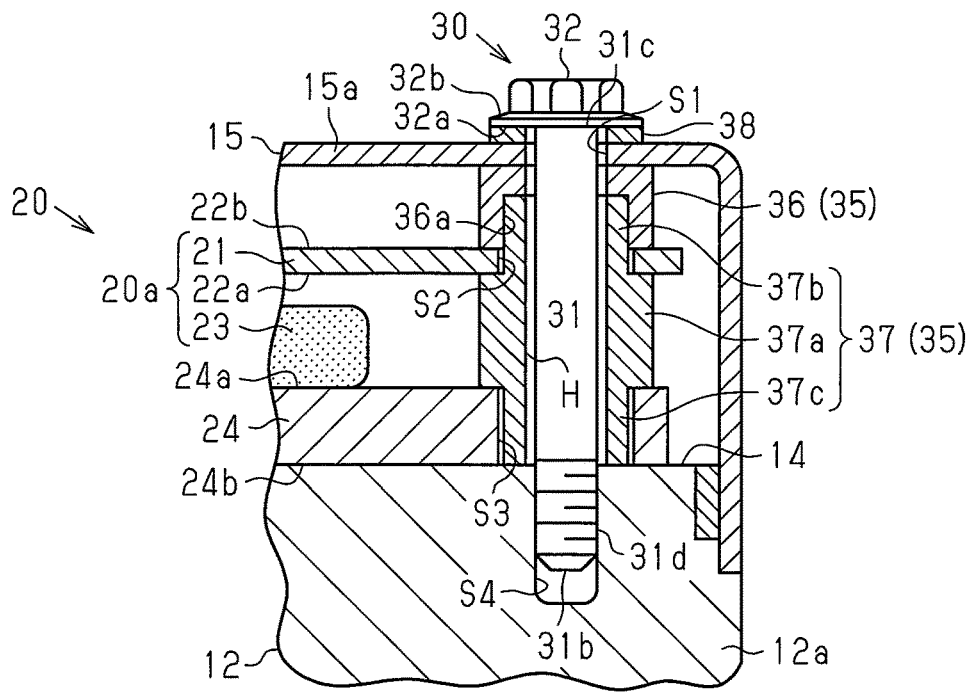
FIG. 2 is a partial cross-sectional view illustrating an inverter assembling structure.

As shown in FIG. 2, the inverter module 20 has an inverter 20a and a plate-shaped base member 24 as a heat radiating member. The inverter 20a has a circuit board 21 and various types of electronic components.

The circuit board 21 has a first surface 22a and a second surface 22b, which is on the opposite side from the first surface 22a. Various types of electronic components are mounted on the circuit board 21. The electronic components mounted on the circuit board 21 include, for example, an electrolytic capacitor, a coil, and a semiconductor element. These electronic components generate heat when the inverter 20a is driven. FIG. 2 shows an electrolytic capacitor 23, which is an electronic component.

The base member 24 has a first surface 24a and a second surface 24b, which is on the opposite side from the first surface 24a. The thickness of the base member 24 corresponds to the separation distance between the first surface 24a and the second surface 24b. The base member 24 is made of a metal material such as aluminum, and is manufactured by die casting, for example.

Some of the electronic components mounted on the circuit board 21 are placed on the first surface 24a of the base member 24. FIG. 2 shows the electrolytic capacitor 23 as an example of an electronic component placed on the first surface 24a of the base member 24. The first surface 24a of the base member 24 is a placement surface for electronic components. The electronic components are in contact with the first surface 24a of the base member 24. When the base member 24 is attached to the outer surface 14 of the first housing member 12, the second surface 24b of the base member 24 serves as a contact surface, which is in contact with the outer surface 14 of the first housing member 12. The contact between the first surface 24a of the base member 24 and the electronic components and the contact between the second surface 24b of the base member 24 and the outer surface 14 of the first housing member 12 are not limited to direct contact between the surfaces, but may be indirect contact with an adhesive layer interposed between the surfaces. The first surface 24a of the base member 24 also faces the first surface 22a of the circuit board 21.

Hereinafter, the assembling structure of the inverter module 20 and the cover 15 in the present embodiment will be described with reference to FIG. 2.

As shown in FIG. 2, the inverter module 20 and the cover 15 are attached to the outer surface 14 of the first housing member 12. In this state, the circuit board 21 and the cover 15 are arranged in this order from the base member 24, which is closest to the outer surface 14 of the first housing member 12. The outer surface 14 of the first housing member 12 thus faces the second surface 24b of the base member 24. The first surface 24a of the base member 24 also faces the first surface 22a of the circuit board 21. The second surface 22b of the circuit board 21 faces the bottom portion 15a of the cover 15. That is, the circuit board 21 is arranged between the bottom portion 15a of the cover 15 and the outer surface 14 of the first housing member 12 and faces both of the bottom portion 15a of the cover 15 and the outer surface 14 of the first housing member 12. Also, the base member 24 is arranged between the circuit board 21 and the outer surface 14 of the first housing member 12 and faces both of the circuit board 21 and the outer surface 14 of the first housing member 12.

The bottom portion 15a of the cover 15, the circuit board 21, the base member 24, and the bottom wall 12a of the first housing member 12 have insertion holes S1, S2, S3, S4, respectively. The insertion holes S1 of the cover 15, the insertion holes S2 of the circuit board 21, and the insertion holes S3 of the base member 24 extend through the cover 15, the circuit board 21, and the base member 24, respectively. The insertion holes S4 of the bottom wall 12a of the first housing member 12 are holes having a bottom.

The inverter module 20 and the cover 15 are fastened and fixed to the bottom wall 12a of the first housing member 12 by using fasteners 30 inserted into the insertion holes S1 to S4. The inverter module 20 and the cover 15 are fastened to each other by screw fastening of the fasteners 30. FIG. 2 shows only one of the fastening portions, showing only one fastener 30. The assembling structure described here is the same as the assembling structure in each fastening portion.

The fastener 30 has a columnar fastening pin 31 and a head 32 integrated with the fastening pin 31. The fastening pin 31 has a first end 31b and a second end 31c, which are the opposite ends in the axial direction. The fastening pin 31 has a threaded portion 31d in the circumferential surface of the first end 31b so as to have the same function as a tapping screw. The head 32 is provided at the second end 31c of the fastening pin 31.

The head 32 forms part of a bolt with a hexagonal flange and has a seating surface 32a. The seating surface 32a of the head 32 is provided with a flange 32b. A collar 35 is arranged between the cover 15 and the outer surface 14 of the first housing member 12. The collar 35 serves as a gap maintaining member that maintains the gap between the cover 15 and the base member 24.

The fastener 30 fastens the cover 15 and the circuit board 21, which are members to be fastened, to the first housing member 12. The collar 35 is composed of a first collar member 36 and a second collar member 37. The first collar member 36 and the second collar member 37 are both made of resin.

A first collar member 36 is arranged between the cover 15 and the circuit board 21 and maintains the gap between the cover 15 and the circuit board 21. The second collar member 37 is arranged between the circuit board 21 and the outer surface 14 of the first housing member 12 and maintains the gap between the circuit board 21 and the base member 24. The first collar member 36 and the second collar member 37 are both tubular. The inner circumferential surfaces of the first collar member 36 and the second collar member 37 define an insertion hole into which the fastener 30 is inserted.

The second collar member 37 has a tubular first body portion 37a, a tubular second body portion 37b, and a tubular third body portion 37c. The first body portion 37a is arranged between the circuit board 21 and the base member 24. The second body portion 37b protrudes in the axial direction from the first end of the first body portion 37a and is inserted into the insertion hole S2 of the circuit board 21 and protrudes from the insertion hole S2. The third body portion 37c protrudes in the axial direction from the second end of the first body portion 37a and is inserted into the insertion hole S3 of the base member 24. The first body portion 37a, the second body portion 37b, and the third body portion 37c are integrated. The inner diameter of the through-hole H of the second collar member 37, that is, the inner diameter of the second collar member 37 is the same throughout the axial length. The thickness of the wall of the first body portion 37a is greater than the thickness of the wall of each of the second body portion 37b and third body portion 37c. The outer diameter of the second body portion 37b is less than the diameter of the insertion hole S2 of the circuit board 21. The outer diameter of the third body portion 37c is less than the diameter of the insertion hole S3 of the base member 24. The outer diameter of the first body portion 37a is greater than the diameters of the insertion hole S2 and the insertion hole S3.

The first collar member 36 is tubular and is arranged between the circuit board 21 and the bottom portion 15a of the cover 15. The outer diameter of the first collar member 36 is greater than the diameter of the insertion hole S2. The inner diameter of the first collar member 36 is the same as the inner diameter of the second collar member 37 in the vicinity of the cover 15. In the vicinity of the circuit board 21, the inner diameter of the first collar member 36 is slightly less than the diameter of the insertion hole S2 and slightly greater than the outer diameter of the second body portion 37b. That is, the first collar member 36 has a step on the inner circumferential surface. Between the first collar member 36 and the second collar member 37, the second body portion 37b of the second collar member 37 is fitted to a portion 36a of the first collar member 36 that is slightly greater than the outer diameter of the second body portion 37b. The first collar member 36 and the second collar member 37 thus constitute the collar 35, which maintains the gap between the cover 15 and the base member 24 and the gap between the circuit board 21 and the base member 24.

Hereinafter, an operation of the motor-driven compressor 10 of the present embodiment will be described together with the method for assembling the inverter module 20 and the cover 15 with reference to FIG. 2.

In the present embodiment, the bottom wall 12a of the first housing member 12, the cover 15, and the circuit board 21 are assembled by using the fasteners 30 inserted into the insertion holes S1 of the cover 15, the insertion holes S2 of the circuit board 21, the insertion holes S3 of the base member 24, and the insertion holes S4 of the bottom wall 12a of the first housing member 12.

In the assembling operation, the base member 24 is first fixed to the bottom wall 12a of the first housing member 12 such that the insertion hole S4 of the bottom wall 12a of the first housing member 12 and the insertion hole S3 of the base member 24 communicate and face with each other.

Next, the third body portion 37c of the second collar member 37 is inserted into the insertion hole S3 of the base member 24, and the second body portion 37b of the second collar member 37 is inserted into the insertion hole S2 of the circuit board 21. Then, the first collar member 36 is fitted to the second body portion 37b of the second collar member 37 projecting from the insertion hole S2 of the circuit board 21. This causes the circuit board 21 to be temporarily fixed to the first housing member 12 by being sandwiched between the first collar member 36 and the first body portion 37a of the second collar member 37. In the temporarily fixed state, the fastener 30 has not been inserted into the first collar member 36 or the second collar member 37. Also, the cover 15 has not been assembled to the first housing member 12.

Thus, the second surface 22b of the circuit board 21 is exposed. In the temporarily fixed condition, the electronic components and the like are mounted on the second surface 22b of the circuit board 21 by soldering or the like.

After mounting the electronic components, the cover 15 is placed on the first collar member 36 such that the insertion hole of the first collar member 36 and the insertion hole S1 of the cover 15 communicate and face with each other. Next, a washer 38 is placed on the fastening pin 31 of the fastener 30 in a manner the faster pin 31 is inserted through the washer 38 so that the washer 38 is arranged between the head 32 of the fastener 30 and the cover 15. Then, the fastening pin 31 is inserted into the insertion holes S1 to S4 and the insertion hole of the collar 35.

Then, screw fastening of the fastener 30 is performed. Then, the threaded portion 31d of the fastening pin 31 is pushed into the insertion hole S4 while forming an internal thread on the inner surface of the insertion hole S4 of the first housing member 12. This fixes the cover 15 and the circuit board 21 to the bottom wall 12a of the first housing member 12. At this time, the distance between the cover 15 and the circuit board 21 is maintained by the first collar member 36. The distance between the circuit board 21 and the bottom wall 12a of the first housing member 12 and the distance between the circuit board 21 and the base member 24 are maintained by the second collar member 37. In other words, the distance between the cover 15 and the outer surface 14 of the first housing member 12 is maintained by the collar 35, which is a combination of the first collar member 36 and the second collar member 37. That is, the space between the circuit board 21 and the base member 24 is maintained by the second collar member 37, and the space between the cover 15 and the base member 24 is maintained by the first collar member 36 and the second collar member 37.

When the screw fastening of the fastener 30 is performed, the seating surface 32a of the head 32 is brought into close contact with the washer 38, and the washer 38 is brought into close contact with the outer surface of the cover 15. This applies the pressing force due to the screw fastening to the cover 15 from the seating surface 32a of the head 32 via the washer 38. That is, since the head 32 has the seating surface 32a, which applies the pressing force to the cover 15, the head 32 serves as a pressing portion.

The pressing force applied to the cover 15 is transmitted to the first collar member 36, which is in contact with the cover 15, and then transmitted to the base member 24 through the circuit board 21 and the second collar member 37. In other words, the pressing force applied to the cover 15 is transmitted to the base member 24 through the collar 35, which is arranged between the cover 15 and the base member 24. This presses the base member 24 against the outer surface 14 of the first housing member 12. Therefore, the contact between the base member 24 and the outer surface 14 of the first housing member 12 is enhanced.

As described above, the collar 35 is arranged to face the seating surface 32a such that the cover 15 is sandwiched between the collar 35 and the seating surface 32a of the fastener 30. Thus, the collar 35 has a facing portion that faces the seating surface 32a and receives the pressing force from the seating surface 32a via the cover 15. Further, the collar 35 has a transmitting portion that transmits the pressing force received by the facing portion to the base member 24. The transmitting portion is a portion of the first body portion 37a that is in contact with the base member 24 and is sandwiched between the circuit board 21 and the base member 24.

As described above, in the motor-driven compressor 10 of the present embodiment, the cover 15 and the circuit board 21 are fixed to the bottom wall 12a of the first housing member 12 by the fasteners 30. That is, the cover 15 and the circuit board 21 are fastened together by the fasteners 30, each of which is a single component. The fastening is executed by the multiple fasteners 30. In the present embodiment, for example, if there are three fastening portions, the cover 15 and the circuit board 21 are fixed to the bottom wall 12a of the first housing member 12 by using three fasteners 30.

The present embodiment thus achieves the following advantages.

(1) The pressing force applied by the seating surface 32a of the fastener 30 is transmitted to the base member 24 through the collar 35. The transmitted pressing force presses the base member 24 against the outer surface 14 of the first housing member 12 (the housing 11). This enhances the contact between the base member 24 and the outer surface 14. The heat radiation performance is thus improved.

(2) Part of the first body portion 37a of the collar 35 is sandwiched between the circuit board 21 and the base member 24 and is in contact with both of the circuit board 21 and the base member 24. The pressing force transmitted from the fastener 30 to the circuit board 21 is thus reliably transmitted to the base member 24.

(3) Since the base member 24 is in contact with the outer surface 14 of the first housing member 12, the heat generated by the electronic components is efficiently transferred to the first housing member 12 through the base member 24.

(4) The electronic components are placed on the base member 24 to be in contact with the base member 24. This allows the heat generated by the electronic components to be efficiently transferred to the base member 24.

(5) The circuit board 21 is temporarily fixed to the first housing member 12 by being sandwiched between the first collar member 36 and the second collar member 37. Therefore, the circuit board 21 can be held at a desired position. Therefore, when assembling the inverter 20a, the operation for mounting the electronic components on the circuit board 21 is facilitated.

(6) The cover 15 and the circuit board 21 are fixed to the bottom wall 12a of the first housing member 12 by using the fasteners 30, each of which is a single component. Therefore, it is unnecessary to use a set of fasteners to fix the cover 15 to the first housing member 12 and a different set of fasteners to fix the circuit board 21 to the first housing member 12. Instead, the same fasteners 30 can be used. This reduces the number of the fasteners 30 necessary for assembling the inverter 20a to the housing 11.

(7) Generally, as the number of fasteners increases, the number of fastening portions also increases. Therefore, in order to ensure sufficient number of fastening portions, it is necessary to increase the overall size of the inverter 20a in consideration of the size of the fasteners 30 to be used. In this regard, in the present embodiment, since the number of the fasteners 30 and the number of fastening portions necessary for assembling the inverter 20a are small, the overall size of the inverter 20a can be reduced.

Second Embodiment

A motor-driven compressor 10 according to a second embodiment, which is a fluid machine, will now be described with reference to FIG. 3. In the embodiments described below, the same reference numerals are given to those components that the same as the corresponding components of the above-described embodiment, and redundant explanations are omitted or simplified.

Figure 3:
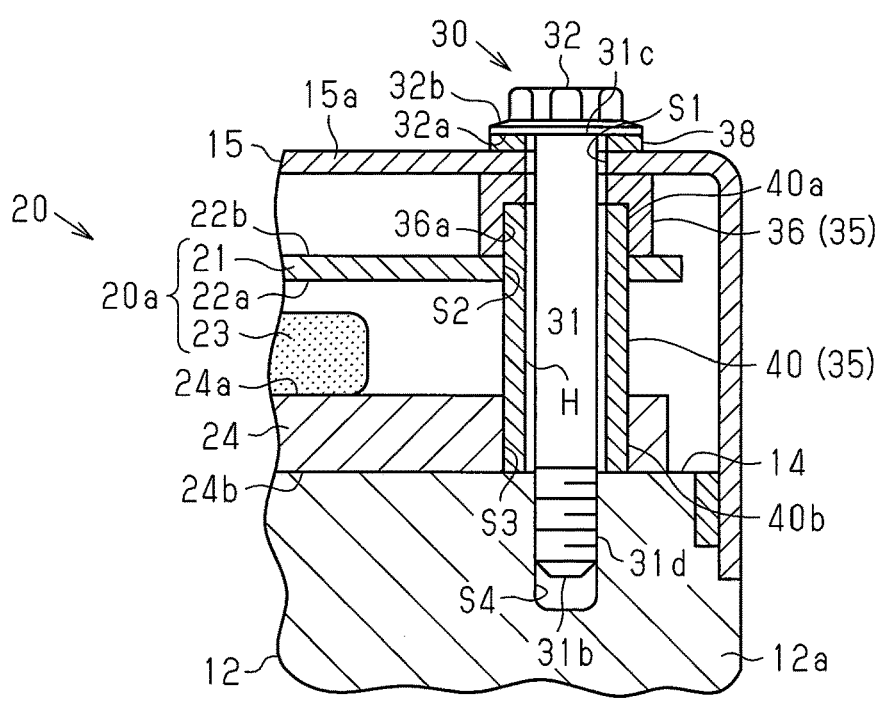
FIG. 3 is a partial cross-sectional view illustrating an inverter assembling structure according to another embodiment.

As shown in FIG. 3, a collar 35 of the present embodiment is composed of a first collar member 36 and a second collar member 40, which has a different shape from the second collar member 37 of the first embodiment. The second collar member 40 is tubular. The outer diameter of the second collar member 40 is the same throughout the axial length. The outer diameter of the second collar member 40 is larger than the diameter of the insertion hole S2 of the circuit board 21. Therefore, when a first end 40a in the axial direction of the second collar member 40 is inserted into the insertion hole S2 of the circuit board 21, the outer circumferential surface of the second collar member 40 is in close contact with the inner circumferential surface of the insertion hole S2 of the circuit board 21. The inner diameter H of the second collar member 40 is greater than the insertion hole S4 of the first housing member 12. A second end 40b of the second collar member 40 cannot be inserted into the insertion hole S4 of the first housing member 12.

Hereinafter, an operation of the motor-driven compressor 10 of the present embodiment will be described together with the method for assembling the inverter module 20 and the cover 15 with reference to FIG. 3.

The assembling method of the present embodiment is the same as the assembling method of the first embodiment. In the present embodiment, the inner circumferential surface of the insertion hole S2 of the circuit board 21 and the outer circumferential surface of the first end 40a of the second collar member 40, which is inserted into the insertion hole S2, are brought into close contact with each other, so that the circuit board 21 is temporarily fixed to the first housing member 12. Also, the manner in which the pressing force applied through the seating surface 32a of the head 32 by the screw fastening of the fastener 30 is transmitted to the base member 24 is different from that in the first embodiment.

Specifically, the pressing force from the fastener 30 is first transmitted to the second collar member 40 through the first collar member 36. Subsequently, the pressing force is transmitted to the base member 24 from the outer circumferential surface of the second end 40b of the second collar member 40, which is in close contact with the inner circumferential surface of the insertion hole S3 of the base member 24. The screw fastening of the fastener 30 transmits the pressing force, which urges the base member 24 toward the outer surface 14 of the first housing member 12, to the second collar member 40 through the first collar member 36. At this time, since the base member 24 and the second collar member 40 are in close contact with each other, the pressing force due to the screw fastening is transmitted to the base member 24 through the second collar member 40. As a result, the base member 24 is pressed against the outer surface 14 of the first housing member 12, enhancing the contact between the base member 24 and the outer surface 14.

The collar 35 of the present embodiment is arranged to face the seating surface 32a such that the cover 15 is sandwiched between the collar 35 and the seating surface 32a of the fastener 30. Thus, the collar 35 has a facing portion that faces the seating surface 32a and receives the pressing force from the seating surface 32a via the cover 15. Further, the collar 35 has a transmitting portion that transmits the pressing force received by the facing portion to the base member 24. The transmitting portion is a portion of the second collar member 40 that is in contact with the base member 24 and is the second end 40b of the second collar member 40.

Accordingly, in addition to the advantages (1) and (3) to (7) of the first embodiment, the present embodiment achieves the following advantages.

(8) The second end 40b of the second collar member 40 is inserted into the insertion hole S3 of the base member 24 and is in close contact with the inner circumferential surface of the insertion hole S3 of the base member 24. Therefore, the pressing force applied by the seating surface 32a is transmitted to the base member 24 via the second end 40b of the second collar member 40.

(9) The second collar member 40 has no step on the outer circumferential surface. Therefore, since the second collar member 40 has a simple shape, it is possible to simplify the machining process as compared with the case of manufacturing a collar having a step in the outer circumferential surface. This reduces the manufacturing costs of the second collar member 40.

Third Embodiment

A motor-driven compressor 10 according to a third embodiment, which is a fluid machine, will now be described with reference to FIG. 4.

Figure 4:
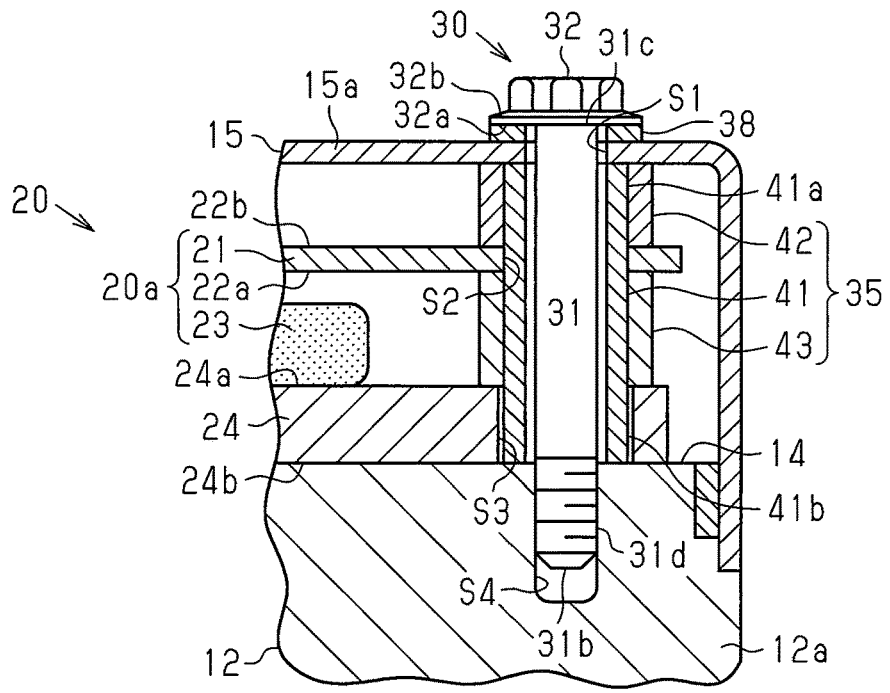
FIG. 4 is a partial cross-sectional view illustrating an inverter assembling structure according to another embodiment.

As shown in FIG. 4, the collar 35 of the present embodiment is composed of a first collar member 41, a second collar member 42, and a third collar member 43. The first collar member 41, the second collar member 42, and the third collar member 43 are all made of resin.

The first collar member 41 is arranged between the cover 15 and the outer surface 14 of the first housing member 12 to maintain the gap between the cover 15 and the outer surface 14 of the first housing member 12. The first collar member 41 is tubular. The inner circumferential surface of the first collar member 41 defines an insertion hole into which the fastener 30 is inserted. The outer diameter of the first collar member 41 is the same throughout the axial length. A first end 41a in the axial direction of the first collar member 41 is inserted into the insertion hole S2 of the circuit board 21. A second end 41b in the axial direction of the first collar member 41 is inserted into the insertion hole S3 of the base member 24. The inner diameter of the first collar member 41 is greater than the insertion hole S1 of the cover 15 and the insertion hole S4 of the first housing member 12. The first end portion 41a of the first collar member 41 cannot be inserted into the insertion hole S1 and the second end 41b of the first collar member 41 cannot be inserted into the insertion hole S4.

A second collar member 42 is arranged between the cover 15 and the circuit board 21 to maintain the gap between the cover 15 and the circuit board 21. The second collar member 42 is tubular. The outer diameter of the second collar member 42 is the same throughout the axial length. The inner diameter of the second collar member 42 is slightly greater than the outer diameter of the first collar member 41. Therefore, when the first end portion 41a of the first collar member 41 is inserted into the second collar member 42, the outer circumferential surface of the first collar member 41 and the inner circumferential surface of the insertion hole of the second collar member 42 come into close contact.

The third collar member 43 is arranged between the circuit board 21 and the base member 24 to maintain the gap between the circuit board 21 and the base member 24. The third collar member 43 is tubular. The outer diameter of the third collar member 43 is the same throughout the axial length. The inner diameter of the third collar member 43 is slightly greater than the outer diameter of the first collar member 41. Therefore, when the first collar member 41 is inserted into the third collar member 43, the outer circumferential surface of the first collar member 41 and the inner circumferential surface of the insertion hole of the third collar member 43 come into close contact.

By fitting the second collar member 42 and the third collar member 43 to the outer circumferential surface of the first collar member 41, the first collar member 41, the second collar member 42, and the third collar member 43 are integrated to constitute the collar 35, which maintains the gap between the cover 15 and the first housing member 12. The second collar member 42 and the third collar member 43 are fitted to the outer circumferential surface of the first collar member 41 while being spaced apart from each other by a predetermined distance in the axial direction of the first collar member 41. The predetermined distance corresponds to the thickness of the circuit board 21. The circuit board 21 is arranged between the second collar member 42 and the third collar member 43.

Hereinafter, an operation of the motor-driven compressor 10 of the present embodiment will be described together with the method for assembling the inverter module 20 and the cover 15 with reference to FIG. 4.

In the motor-driven compressor 10 of the present embodiment, the bottom wall 12a of the first housing member 12, the cover 15, and the circuit board 21 are assembled by using the fasteners 30 inserted into the insertion holes S1 of the cover 15, the insertion holes S2 of the circuit board 21, the insertion holes S3 of the base member 24, and the insertion holes S4 of the bottom wall 12a of the first housing member 12.

In the assembling operation, the base member 24 is first fixed to the bottom wall 12a of the first housing member 12 such that the insertion hole S4 of the bottom wall 12a of the first housing member 12 and the insertion hole S3 of the base member 24 communicate and face with each other.

Next, the first collar member 41 is inserted into the insertion hole S3 of the base member 24, and the third collar member 43 is fitted to the first collar member 41. Then, the first collar member 41 is inserted into the insertion hole S2 of the circuit board 21. The second collar member 42 is fitted to the first collar member 41, which projects from the insertion hole S2 of the circuit board 21. This causes the circuit board 21 to be temporarily fixed to the first housing member 12 by being sandwiched between the second collar member 42 and the third collar member 43. In the temporarily fixed state, the fastener 30 has not been inserted into the first collar member 41. Also, the cover 15 has not been assembled to the first housing member 12. Thus, the second surface 22b of the circuit board 21 is exposed. In the temporarily fixed condition, the electronic components and the like are mounted on the second surface 22b of the circuit board 21 by soldering or the like.

After mounting the electronic components, the cover 15 is placed on the first collar member 41 such that the insertion hole of the first collar member 41 and the insertion hole S1 of the cover 15 communicate and face with each other. Next, a washer 38 is placed on the fastening pin 31 of the fastener 30 so that the washer 38 is arranged between the head 32 of the fastener 30 and the cover 15. Then, the fastening pin 31 is inserted into the insertion holes S1 to S4 and the insertion hole of the collar 35.

Then, screw fastening of the fastener 30 is performed. Then, the threaded portion 31d of the fastening pin 31 is pushed into the insertion hole S4 while forming an internal thread on the inner surface of the insertion hole S4 of the first housing member 12. This fixes the cover 15 and the circuit board 21 to the bottom wall 12a of the first housing member 12. At this time, the distance between the cover 15 and the circuit board 21 is maintained by the second collar member 42. The distance between the circuit board 21 and the bottom wall 12a of the first housing member 12 and the distance between the circuit board 21 and the base member 24 are maintained by the third collar member 43. In other words, the distance between the cover 15 and the outer surface 14 of the first housing member 12 is maintained by the collar 35, which is a combination of the first collar member 41, the second collar member 42, and the third collar member 43.

When the screw fastening of the fastener 30 is performed, the seating surface 32a of the head 32 is brought into close contact with the washer 38, and the washer 38 is brought into close contact with the outer surface of the cover 15. This applies the pressing force due to the screw fastening to the cover 15 from the seating surface 32a of the head 32 via the washer 38.

The pressing force applied to the cover 15 is transmitted to the second collar member 42, which is in contact with the cover 15, and then transmitted to the base member 24 through the circuit board 21 and the third collar member 43. In other words, the pressing force applied to the cover 15 is transmitted to the base member 24 through the collar 35, which is arranged between the cover 15 and the base member 24. This presses the base member 24 against the outer surface 14 of the first housing member 12. Therefore, the contact between the base member 24 and the outer surface 14 of the first housing member 12 is enhanced.

As described above, the collar 35 is arranged to face the seating surface 32a such that the cover 15 is sandwiched between the collar 35 and the seating surface 32a of the fastener 30. Thus, the collar 35 has a facing portion that faces the seating surface 32a and receives the pressing force from the seating surface 32a via the cover 15. Further, the collar 35 has a transmitting portion that transmits the pressing force received by the facing portion to the base member 24. The transmitting portion is a portion of the third collar member 43 that is in contact with the base member 24 and is sandwiched between the circuit board 21 and the base member 24.

As described above, in the motor-driven compressor 10 of the present embodiment, the cover 15 and the circuit board 21 are fixed to the bottom wall 12a of the first housing member 12 by the fasteners 30. That is, the cover 15 and the circuit board 21 are fastened together by the fasteners 30, each of which is a single component. The present embodiment achieves the same advantages as the advantages (1) to (7) of the first embodiment.

Fourth Embodiment

A motor-driven compressor 10 according to a fourth embodiment, which is a fluid machine, will now be described with reference to FIG. 5.

Figure 5:
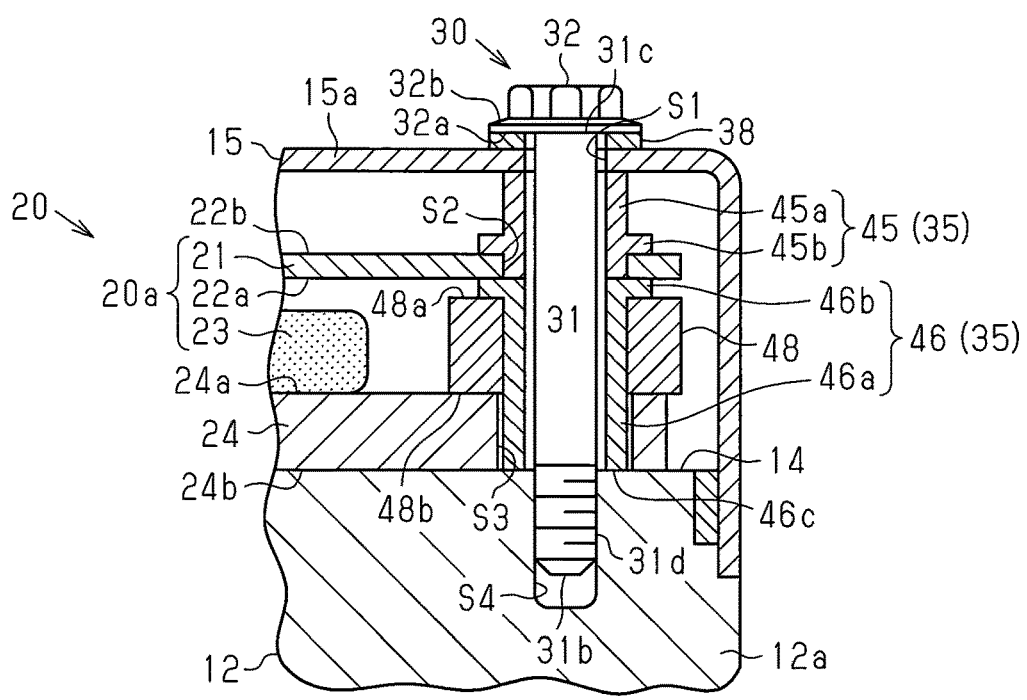
FIG. 5 is a partial cross-sectional view illustrating an inverter assembling structure according to another embodiment.

As shown in FIG. 5, the collar 35 of the present embodiment is composed of a first collar member 45, a second collar member 46, and a third collar member 48. The first collar member 45, the second collar member 46, and the third collar member 48 are all made of resin.

A first collar member 45 is arranged between the cover 15 and the circuit board 21 to maintain the gap between the cover 15 and the circuit board 21. The first collar member 45 is tubular. The inner circumferential surface of the first collar member 45 defines an insertion hole into which the fastener 30 is inserted. The first collar member 45 has a body portion 45a and a first flange portion 45b. The outer diameter of the body portion 45a is the same throughout the axial length. The first flange portion 45b protrudes outward in the radial direction from the body portion 45a and has an annular shape.

When the end of the first collar member 45 is inserted into the insertion hole S2 of the circuit board 21, the outer circumferential surface of the body portion 45a comes into close contact with the inner circumferential surface of the insertion hole S2 of the circuit board 21, and the end face of the first flange portion 45b is in close contact with the circuit board 21.

The second collar member 46 is tubular. The inner circumferential surface of the second collar member 46 defines an insertion hole into which the fastener 30 is inserted. The inner diameter of the insertion hole of the second collar member 46 is the same as the inner diameter of the insertion hole of the first collar member 45.

The second collar member 46 has a body portion 46a and a second flange portion 46b. The outer diameter of the body portion 46a is the same throughout the axial length. The second flange portion 46b protrudes outward in the radial direction from one end of the body portion 46a and has an annular shape. In the present embodiment, the inner diameter and the outer diameter of the body portion 46a of the second collar member 46 are the same as the inner diameter and the outer diameter of the body portion 45a of the first collar member 45, respectively. The second collar member 46 is arranged between the circuit board 21 and the bottom wall 12a of the first housing member 12 to maintain the gap between the circuit board 21 and the base member 24. The body portion 46a has an end 46c that is on the opposite side from the second flange portion 46b and inserted into the insertion hole S3 of the base member 24. The end face of the second flange portion 46b of the second collar member 46 is in contact with both of the end portion of the first collar member 45 and the circuit board 21.

The third collar member 48 is tubular. The outer diameter of the third collar member 48 is the same throughout the axial length. The inner circumferential surface of the third collar member 48 defines an insertion hole into which the body portion 46a of the second collar member 46 is inserted.

The inner diameter of the third collar member 48 is slightly greater than the outer diameter of the body portion 46a of the second collar member 46. Therefore, when the body portion 46a of the second collar member 46 is inserted into the third collar member 48, the outer circumferential surface of the second collar member 46 and the inner circumferential surface of the insertion hole of the third collar member 48 come into close contact.

Further, a first end face 48a in the axial direction of the third collar member 48 abuts against the second flange portion 46b of the second collar member 46. Also, a second end face 48b in the axial direction of the third collar member 48 abuts against the first surface 24a of the base member 24, which faces the circuit board 21. That is, the outer diameter of the third collar member 48 is greater than the diameter of the insertion hole S3 of the base member 24.

Hereinafter, an operation of the motor-driven compressor 10 of the present embodiment will be described together with the method for assembling the inverter module 20 and the cover 15 with reference to FIG. 5.

In the present embodiment, the bottom wall 12a of the first housing member 12, the cover 15, and the circuit board 21 are assembled by using the fasteners 30 inserted into the insertion holes S1 of the cover 15, the insertion holes S2 of the circuit board 21, the insertion holes S3 of the base member 24, and the insertion holes S4 of the bottom wall 12a of the first housing member 12.

In the assembling operation, the base member 24 is first fixed to the bottom wall 12a of the first housing member 12 such that the insertion hole S4 of the bottom wall 12a of the first housing member 12 and the insertion hole S3 of the base member 24 communicate and face with each other.

Next, the second collar member 46 is inserted into the third collar member 48, and the end 46c of the second collar member 46, which is inserted into the third collar member 48, is inserted into the insertion hole S3 of the base member 24. Next, the circuit board 21 is placed on the second flange portion 46b of the second collar member 46, and the end in the axial direction of the first collar member 45 is inserted into the insertion hole S2. This causes the circuit board 21 to be temporarily fixed to the first housing member 12 by being sandwiched between the first flange portion 45b of the first collar member 45 and the second flange portion 46b of the second collar member 46. In the temporarily fixed state, the fastener 30 has not been inserted into the first collar member 45. Also, the cover 15 has not been assembled to the first housing member 12. Thus, the second surface 22b of the circuit board 21 is exposed. In the temporarily fixed condition, the electronic components and the like are mounted on the second surface 22b of the circuit board 21 by soldering or the like.

After mounting the electronic components, the cover 15 is placed on the first collar member 45 such that the insertion hole of the first collar member 45 and the insertion hole S1 of the cover 15 communicate and face with each other. Next, a washer 38 is placed on the fastening pin 31 of the fastener 30 so that the washer 38 is arranged between the head 32 of the fastener 30 and the cover 15. Then, the fastening pin 31 is inserted into the insertion holes S1 to S4 and the insertion hole of the collar 35.

Then, screw fastening of the fastener 30 is performed. Then, the threaded portion 31d of the fastening pin 31 is pushed into the insertion hole S4 while forming an internal thread on the inner surface of the insertion hole S4 of the first housing member 12. This fixes the cover 15 and the circuit board 21 to the bottom wall 12a of the first housing member 12. At this time, the distance between the cover 15 and the circuit board 21 is maintained by the first collar member 45. The distance between the circuit board 21 and the bottom wall 12a of the first housing member 12 is maintained by the second collar member 46. Also, the distance between the circuit board 21 and the base member 24 is maintained by the third collar member 48. In other words, the distance between the cover 15 and the outer surface 14 of the first housing member 12 is maintained by the collar 35, which is a combination of the first collar member 45, the second collar member 46, and the third collar member 48.

When the screw fastening of the fastener 30 is performed, the seating surface 32a of the head 32 is brought into close contact with the washer 38, and the washer 38 is brought into close contact with the outer surface of the cover 15. This applies the pressing force due to the screw fastening to the cover 15 from the seating surface 32a of the head 32 via the washer 38.

The pressing force applied to the cover 15 is transmitted to the first collar member 45, which is in contact with the cover 15, and then transmitted to the base member 24 through the circuit board 21, the second collar member 46, and the third collar member 48. In other words, the pressing force applied to the cover 15 is transmitted to the base member 24 through the collar 35, which is arranged between the cover 15 and the base member 24. This presses the base member 24 against the outer surface 14 of the first housing member 12. Therefore, the contact between the base member 24 and the outer surface 14 of the first housing member 12 is enhanced.

As described above, the collar 35 is arranged to face the seating surface 32a such that the cover 15 is sandwiched between the collar 35 and the seating surface 32a of the fastener 30. Thus, the collar 35 has a facing portion that faces the seating surface 32a and receives the pressing force from the seating surface 32a via the cover 15. Further, the collar 35 has a transmitting portion that transmits the pressing force received by the facing portion to the base member 24. The transmitting portion is a portion of the third collar member 48 that is in contact with the base member 24 (the second end face 48b) and is sandwiched between the circuit board 21 and the base member 24.

As described above, in the motor-driven compressor 10 of the present embodiment, the cover 15 and the circuit board 21 are fixed to the bottom wall 12a of the first housing member 12 by the fasteners 30. That is, the cover 15 and the circuit board 21 are fastened together by the fasteners 30, each of which is a single component. The present embodiment achieves the same advantages as the advantages (1) to (7) of the first embodiment.

The above illustrated embodiments may be modified as follows.

The assembling structure of each embodiment may be used to fasten the circuit board 21 and the base member 24 together. Also, the assembling structure of each embodiment may be used to fasten the cover 15, the base member 24, and the first housing member 12 together. That is, the assembling structure of each embodiment is an assembling structure in which the cover 15, the circuit board 21, and the base member 24 are jointly fastened to the first housing member 12 by the fasteners 30, each of which is a single component. In contrast, the assembling structure described in this modification is a structure in which the fasteners 30 fasten either the cover 15 or the circuit board 21 to the first housing member 12. For example, when fastening the circuit board 21 to the base member 24, the fasteners 30 may be fastened to the base member 24 with collars arranged between the circuit board 21 and the base member 24.

In the first, third, and fourth embodiments, a portion where the collar 35 and the outer surface 14 of the first housing member 12 face each other with the base member 24 in between is defined as a portion for transmitting the pressing force of the seating surface 32a. Therefore, in order to enhance the contact of the base member 24 to the outer surface 14 of the first housing member 12, it is not necessary to provide the insertion member S3 in the base member 24. In this case, the base member 24 can be temporarily fixed to the first housing member 12 by being bonded to the first housing member 12. Also, after the cover 15 is assembled, the base member 24 can be fixed to the first housing member 12 by the bonding force and the pressing force.

The cross-sectional shapes of the elements that constitute the collar 35 in each embodiment, for example, the cross-sectional shapes of the first collar member 36 and the second collar member 37 in the first embodiment, may be circular or polygonal.

The elements that constitute the collar 35 of each embodiment may be entirely or partially made of metal while ensuring the insulation property from the electronic components mounted on the circuit board 21. For example, each element may have a double structure in which the inner part is made of metal and the outer part is made of resin.

In the first embodiment, the first collar member 36 may be press-fitted into the second body portion 37b of the second collar member 37. The second body portion 37b of the second collar member 37 may be an external thread portion, and the portion 36a of the first collar member 36, into which the second body portion 37b of the second collar member 37 is inserted, may be an internal thread portion. In this case, the first collar member 36 is screwed into the second body portion 37b of the second collar member 37. This modification can also be applied to the assembly of the first collar member 36 and the second collar member 40 of the second embodiment.

In the third embodiment, the second collar member 42 and the third collar member 43 may be press-fitted into the first collar member 41. Also, the outer surface of the first collar member 41 may be an external thread portion, and the inner surfaces of the second and third collar members 42, 43 may be internal thread portions. In this case, the second and third collar members 42, 43 are screwed into the first collar member 41.

In the fourth embodiment, the first collar member 45 and the second collar member 46 may be joined by bonding or the like. The circuit board 21 may be temporarily fixed to the first housing member 12 in this manner. In the case where the first collar member 45 and the second collar member 46 are entirely or partially made of metal as in the above-described modification, the first collar member 45 and the second collar member 46 may be welded together.

The distance between the cover 15 and the circuit board 21 and the distance between the circuit board 21 and the outer surface 14 of the first housing member 12 may be arbitrarily changed. These distances may be arbitrarily changed depending on the sizes of the electronic components mounted on the circuit board 21 and the like.

The number of the fasteners 30 may be arbitrarily changed according to the number of fastening portions set for assembling the inverter 20a to the first housing member 12.

An internal thread may be formed in the insertion hole S4 of the bottom wall 12a of the first housing member 12 in advance.

The fluid machine is not limited to the motor-driven compressor 10 but may be any type of fluid machine. For example, when installing a fuel cell in the vehicle, the fluid machine may be an electric pump device that supplies hydrogen to the fuel cell. In this case, the electric pump device is preferably provided with a pump that delivers hydrogen of the hydrogen tank without compressing it and an electric motor that drives the pump.

The interposed substances between the second surface 24b of the base member 24 and the outer surface 14 of the first housing member 12 preferably does not hamper the heat radiation performance of the electronic components such as the electrolytic capacitor 23 mounted on the base member 24.

The cover 15 may be attached to the first housing member 12 so as to define the accommodating space 19 by the cover 15 and the side wall 12b of the first housing member 12.

In the inverter 20a, not only the first surface 22a and the second face 22b of the circuit board 21, but also the surfaces facing the first surface 22a and the second surface 22b may mount electronic components.

Figure 6:
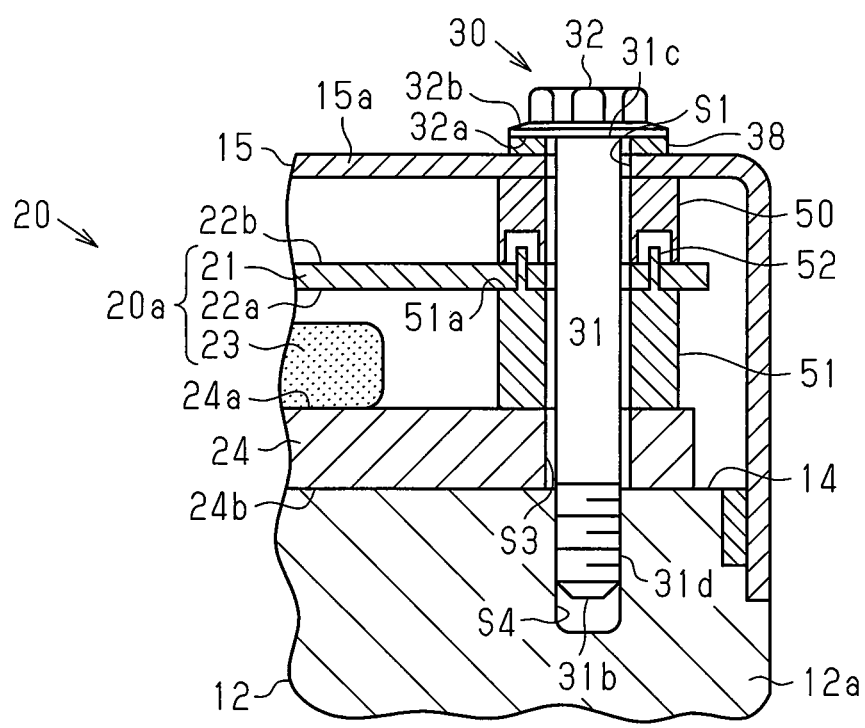
FIG. 6 is a partial cross-sectional view illustrating an inverter assembling structure according to another embodiment.

As shown in FIG. 6, the present invention may be embodied as a structure for assembling the cover 15, the circuit board 21, and the base member 24 to the outer surface 14 of the first housing member 12. In the structure of FIG. 6, a first collar member 50, which serves as a gap maintaining member, is arranged between the cover 15 and the circuit board 21 to maintain the gap between the cover 15 and the circuit board 21. Also, a second collar member 51, which serves as a gap maintain member, is arranged between the circuit board 21 and the base member 24 to maintain the gap between the circuit board 21 and the base member 24. The first collar member 50 and the second collar member 51 are both tubular. A fastener 30 is passed into the first collar member 50 and the second collar member 51. The second collar member 51 has a protrusion 52, which is located on an end face 51a and inserted into the insertion hole of the circuit board 21. The circuit board 21 is temporarily fixed to the second collar member 51 by inserting the protrusion 52 into the insertion hole. When the protrusion 52 is made of metal, the protrusion 52 may be joined to the circuit board 21 by soldering or the like. In this case, the first collar member 50 is in contact with both of the cover 15 and the circuit board 21, and the second collar member 51 is in contact with both of the circuit board 21 and the base member 24. Therefore, the pressing force of the seating surface 32a is transmitted to the second collar member 51, which is in contact with the circuit board 21, through the first collar member 50, which is in contact with the circuit board 21, and then transmitted to the base member 24. This presses the base member 24 against the outer surface 14 of the first housing member 12. Therefore, the contact between the base member 24 and the outer surface 14 of the first housing member 12 is enhanced. In this modification, the fastening portion using the fastener 30 has a facing portion where the seating surface 32a of the fastener 30 and the first collar member 50 face each other with the cover 15 in between. The second collar member 51 has an end that serves as a transmission portion for transmitting the pressing force applied through the seating surface 32a of the fastener 30 to the base member 24. The transmission portion is a portion where the second collar member 51 and the outer surface 14 of the first housing member 12 face each other while interposing the base member 24 in between. The present embodiment achieves the same advantages as the advantages (1) to (7) of the first embodiment.

The invention claimed is:

1. A fluid machine comprising:
   a housing member, which is provided with an inlet into which fluid is drawn;
   an electric motor, which is accommodated in the housing member;
   a cover, which is attached to an outer surface of the housing member;
   an inverter, which is accommodated in an accommodating space defined by the outer surface of the housing member and the cover, has a circuit board on which an electronic component is mounted, and drives the electric motor;
   a heat radiating member, which is arranged between the circuit board and the housing member and on which the electronic component is placed, wherein the heat radiating member radiates heat of the electronic component;
   a fastener, which fastens together the housing member and a member to be fastened, which is at least one of the cover and the circuit board; and
   a gap maintaining member, which maintains a gap between the member to be fastened and the heat radiating member, wherein
   the fastener includes a fastening pin and a pressing portion,
   the fastening pin includes a first end and a second end, which are opposite ends in an axial direction, the first end of the fastening pin is fastened to an insertion hole provided in the housing member, the pressing portion includes a seating surface, which is located at the second end of the fastening pin and applies a pressing force to the member to be fastened, the gap maintaining member is arranged to face the seating surface such that the member to be fastened is sandwiched between the gap maintaining member and the seating surface, and the gap maintaining member includes a facing portion, which faces the seating surface and receives a pressing force from the seating surface via the member to be fastened, and a transmitting portion, which transmits the pressing force received at the facing portion to the heat radiating member.

2. The fluid machine according to claim 1, wherein the transmitting portion is directly or indirectly in contact with the heat radiating member.

3. The fluid machine according to claim 2, wherein the transmitting portion is arranged between the circuit board and the heat radiating member.

4. The fluid machine according to claim 1, wherein the heat radiating member is directly or indirectly in contact with the electronic component.

5. The fluid machine according to claim 1, wherein the heat radiating member is directly or indirectly in contact with the outer surface of the housing member.

6. The fluid machine according to claim 1, wherein the gap maintaining member includes a tubular collar, into which the fastening pin is inserted.

\* \* \* \* \*